(12) United States Patent
Yang et al.

(10) Patent No.: US 11,638,360 B2
(45) Date of Patent: Apr. 25, 2023

(54) ORIENTATION-ADJUSTMENT MECHANISM

(71) Applicant: Wistron NeWeb Corp., Hsinchu (TW)

(72) Inventors: Lan-Chun Yang, Hsinchu (TW);
Chun-Hung Huang, Hsinchu (TW);
Li-Han Hsu, Hsinchu (TW); Yi-Chieh Lin, Hsinchu (TW)

(73) Assignee: WISTRON NEWEB CORP., Hsinchu (TW)

( * ) Notice: Subject to any disclaimer, the term of this patent is extended or adjusted under 35 U.S.C. 154(b) by 1 day.

(21) Appl. No.: 17/500,296

(22) Filed: Oct. 13, 2021

(65) Prior Publication Data
US 2022/0330448 A1     Oct. 13, 2022

(30) Foreign Application Priority Data

Apr. 12, 2021     (TW) ................................. 110113063

(51) Int. Cl.
*H05K 7/02*     (2006.01)
*H05K 5/02*     (2006.01)
*H04B 1/3827*   (2015.01)

(52) U.S. Cl.
CPC ............. *H05K 7/02* (2013.01); *H04B 1/3827* (2013.01); *H05K 5/0234* (2013.01)

(58) Field of Classification Search
None
See application file for complete search history.

(56) References Cited

U.S. PATENT DOCUMENTS

| | | | |
|---|---|---|---|
| 10,234,232 B1* | 3/2019 | Liu | F41A 23/10 |
| 10,760,732 B1* | 9/2020 | Koh | F16M 13/02 |
| 2009/0243954 A1* | 10/2009 | Chen | H01Q 1/1221 |
| | | | 343/878 |
| 2011/0101587 A1* | 5/2011 | Quintania | A61G 7/0503 |
| | | | 269/74 |
| 2015/0144755 A1* | 5/2015 | Chien | F16M 13/04 |
| | | | 248/289.11 |
| 2015/0309395 A1* | 10/2015 | Tomasewski | F16B 1/00 |
| | | | 455/575.1 |
| 2020/0063909 A1* | 2/2020 | Weng | F16M 13/02 |
| 2021/0102661 A1* | 4/2021 | Chen | F16M 11/14 |

FOREIGN PATENT DOCUMENTS

| | | |
|---|---|---|
| TW | M354873 U | 4/2009 |
| TW | I1449991 B | 8/2014 |

* cited by examiner

*Primary Examiner* — James Wu
*Assistant Examiner* — Christopher L Augustin
(74) *Attorney, Agent, or Firm* — McClure, Qualey & Rodack, LLP (57) ABSTRACT

An orientation-adjustment mechanism is provided, which is adapted to be affixed to a mounting surface. The orientation-adjustment mechanism includes a base, a rod, a joint unit, and a mounted member. The base is adapted to be affixed to the mounting surface. The rod includes a first section and a second section. The first section of the rod pivots on the base. The joint unit is disposed on the second section of the rod. The joint unit includes a plurality of joint-positioning portions. The joint-positioning portions include a first joint-positioning portion and a second joint-positioning portion. The mounted member is connected to the joint unit and is adapted to be rotated relative to the joint unit. The mounted member includes a member housing. The member housing includes at least one member-positioning portion.

13 Claims, 12 Drawing Sheets

ORIENTATION-ADJUSTMENT MECHANISM

CROSS REFERENCE TO RELATED APPLICATIONS

This Application claims priority of Taiwan Patent Application No. 110113063, filed on Apr. 12, 2021, the entirety of which is incorporated by reference herein.

BACKGROUND OF THE INVENTION

Field of the Invention

The present invention relates to an orientation-adjustment mechanism, and in particular to an orientation-adjustment mechanism with sufficient rotational freedoms.

Description of the Related Art

Conventionally, an electronic device (such as a wireless router used to transmit wireless signals to a wireless base station) can be mounted on a support structure. The conventional support structure has limited rotational freedom, and the orientation of the electronic device cannot be modified to improve the signal transmission. With the use of 5G technology, the signal-transmission orientation requirements are stricter. The conventional support structure cannot provide sufficient rotational freedom, and the electronic device thus cannot provide adequate signal transmission in an environment full of tall buildings.

BRIEF SUMMARY OF THE INVENTION

Embodiments of the invention are provided to address the aforementioned difficulty.

In one embodiment, an orientation-adjustment mechanism is provided, which is adapted to be affixed to a mounting surface. The orientation-adjustment mechanism includes a base, a rod, a joint unit, and a mounted member. The base is adapted to be affixed to the mounting surface. The rod includes a first section and a second section. The first section of the rod pivots on the base. The joint unit is disposed on the second section of the rod. The joint unit includes a plurality of joint-positioning portions. The joint-positioning portions include a first joint-positioning portion and a second joint-positioning portion. The mounted member is connected to the joint unit and is adapted to be rotated relative to the joint unit. The mounted member includes a member housing. The member housing includes at least one member-positioning portion. When the mounted member is in the first member orientation relative to the joint unit, the member-positioning portion is wedged into the first joint-positioning portion. When the mounted member is in the second member orientation relative to the joint unit, the member-positioning portion is wedged into the second joint-positioning portion.

In one embodiment, the joint-positioning portions are holes, the member housing comprises an elastic arm, the member-positioning portion is a protrusion, and the member-positioning portion is formed on the free end of the elastic arm.

In one embodiment, the mounted member is an electronic device, the mounted member further comprises a wireless transmission module, and the wireless transmission module is disposed inside the member housing.

In one embodiment, the orientation-adjustment mechanism is adapted to be connected to an electronic device, the electronic device is affixed to the mounted member, the electronic device comprises a device housing and a wireless transmission module, and the wireless transmission module is disposed in the device housing.

Utilizing the orientation-adjustment mechanism of the embodiment of the invention, the orientation-adjustment mechanism provides sufficient rotational freedoms, and the electronic device (such as a wireless router) can be adjusted to face left, right, up, or down, and optimal wireless signal transmission is achieved. Therefore, when the electronic device is disposed in a tall building and the wireless base station is disposed on the street, the orientation of the electronic device can be modified to face the wireless base station to improve wireless signal transmission.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
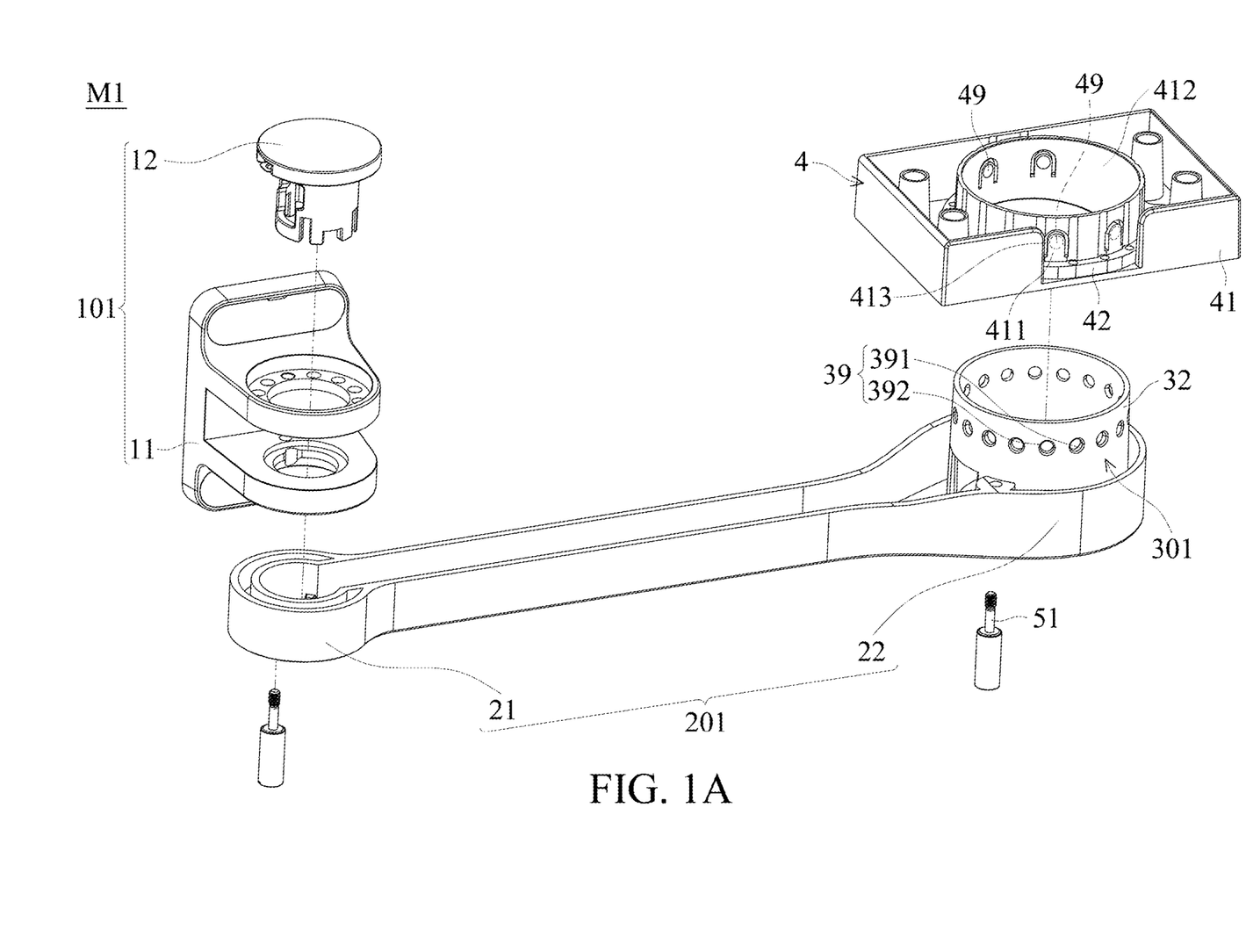
FIG. 1A is an exploded view of an orientation-adjustment mechanism of a first embodiment of the invention.
Figure 1B:
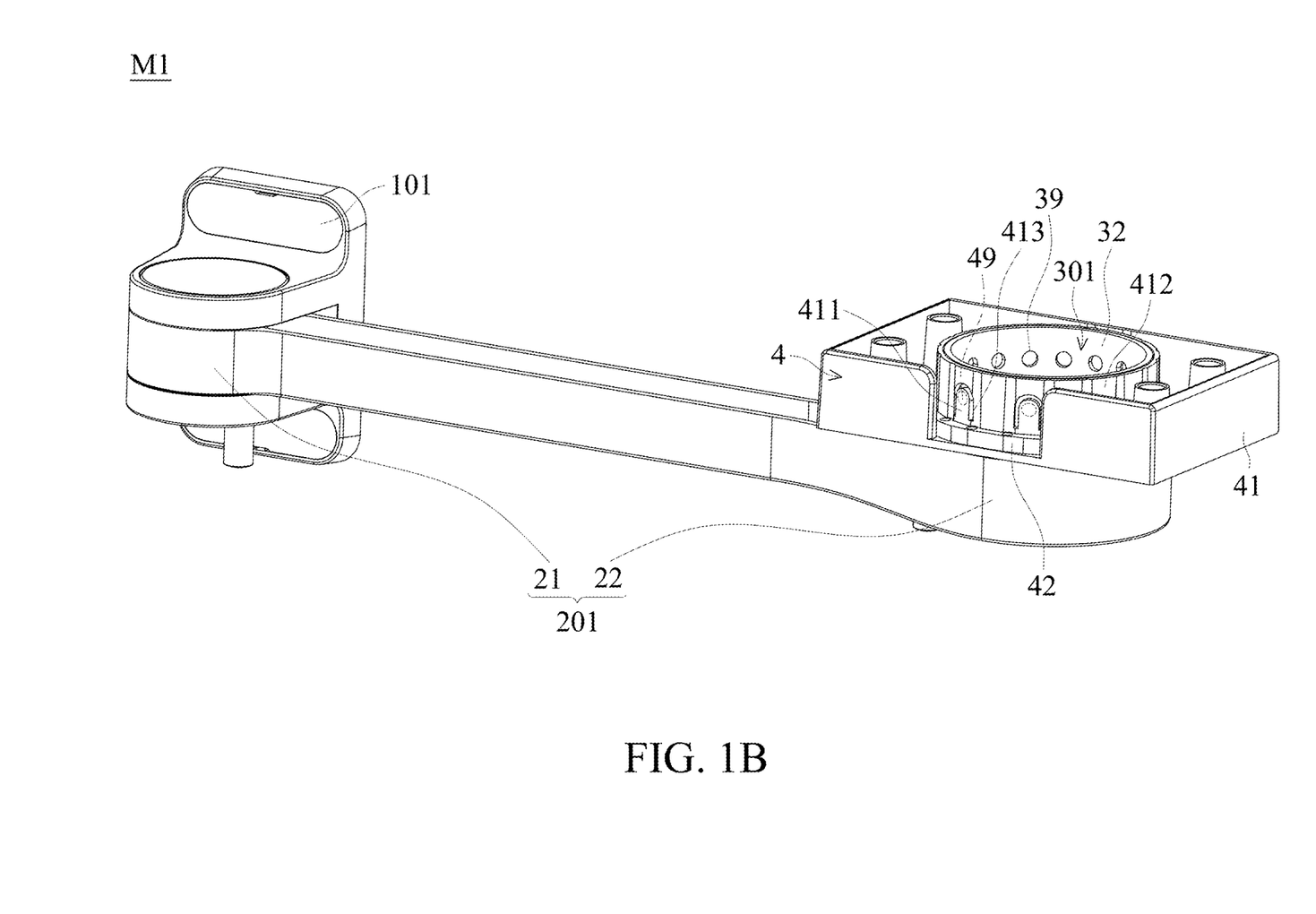
FIG. 1B is an assembled view of the orientation-adjustment mechanism of the first embodiment of the invention, wherein a mounted member is in a first member orientation relative to the joint unit.

FIG. 1A is an exploded view of an orientation-adjustment mechanism of a first embodiment of the invention. FIG. 1B is an assembled view of the orientation-adjustment mechanism of the first embodiment of the invention, wherein a mounted member is in a first member orientation relative to the joint unit. With reference to FIGS. 1A and 1B, in one embodiment, an orientation-adjustment mechanism M1 is provided, which is adapted to be affixed to a mounting surface (not shown). The orientation-adjustment mechanism M1 includes a base 101, a rod 201, a joint unit 301 and a mounted member 4. The base 101 is adapted to be affixed to the mounting surface (not shown). The base 101 comprises a base body 11 and a shaft 12. The rod 201 includes a first section 21 and a second section 22. The first section 21 of the rod 201 pivots on the base 101. The joint unit 301 is disposed on the second section 22 of the rod 201. The joint unit 301 includes a plurality of joint-positioning portions 39. The joint-positioning portions 39 include a first joint-positioning portion 391 and a second joint-positioning portion 392. The mounted member 4 is connected to the joint unit 301 and is adapted to be rotated relative to the joint unit 301. The mounted member 4 includes a member housing 41. The member housing 41 includes at least one member-positioning portion 49.

Figure 1C:
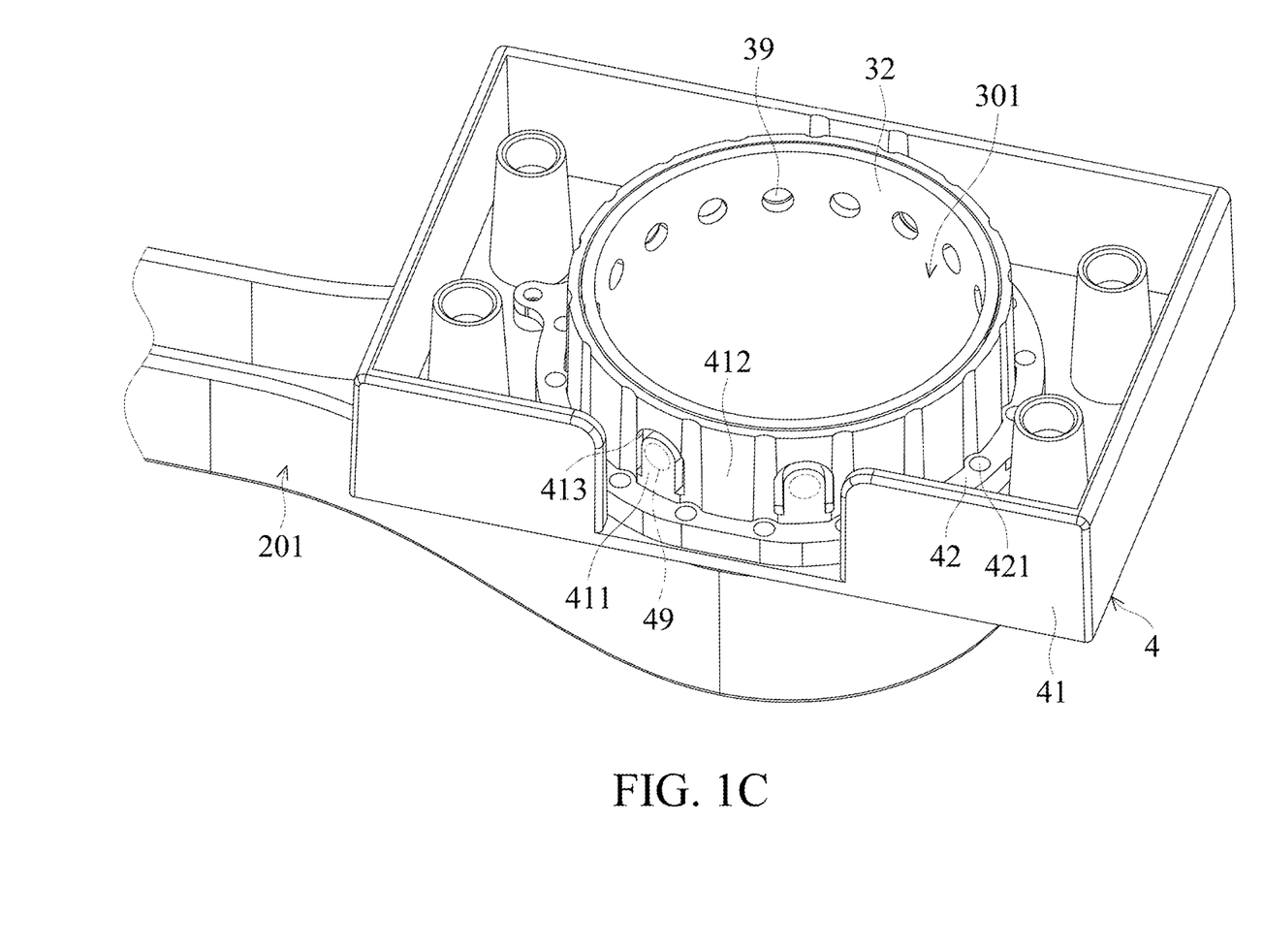
FIG. 1C is an assembled view of the orientation-adjustment mechanism of the first embodiment of the invention, wherein the mounted member is in a second member orientation relative to the joint unit.

FIG. 1C is an assembled view of the orientation-adjustment mechanism of the first embodiment of the invention, wherein the mounted member is in a second member orientation relative to the joint unit. With reference to FIGS. 1B and 1C, when the mounted member 4 is in the first member orientation relative to the joint unit 301, the member-positioning portion 49 is wedged into the first joint-positioning portion 391. When the mounted member 4 is in the second member orientation relative to the joint unit 301, the member-positioning portion 49 is wedged into the second joint-positioning portion 392.

With reference to FIGS. 1A, 1B and 1C, in one embodiment, the joint-positioning portions 39 are holes. The member housing 41 comprises an elastic arm 411. The member-positioning portion 49 is a protrusion. The member-positioning portion 49 is formed on the free end of the elastic arm 411. The member-positioning portion 49 is elastically wedged into one of the joint-positioning portions 39 to position the mounted member 4 is a particular orientation relative to the joint unit 301.

With reference to FIGS. 1A, 1B and 1C, in one embodiment, the joint unit 301 comprises a joint ring 32, the member housing 41 comprises a mounted ring 412, the mounted ring 412 is telescoped on the joint ring 32, the joint-positioning portions 39 are disposed around the joint ring 32, and the mounted ring 412 comprises at least one mounted ring opening 413. The member-positioning portion 49 is disposed in the mounted ring opening 413, and is selective connected one of the joint-positioning portions 39.

With reference to FIGS. 1A, 1B and 1C, in one embodiment, the elastic arm 411 is disposed on the mounted ring 412 and extends in the mounted ring opening 413.

Figure 1D:
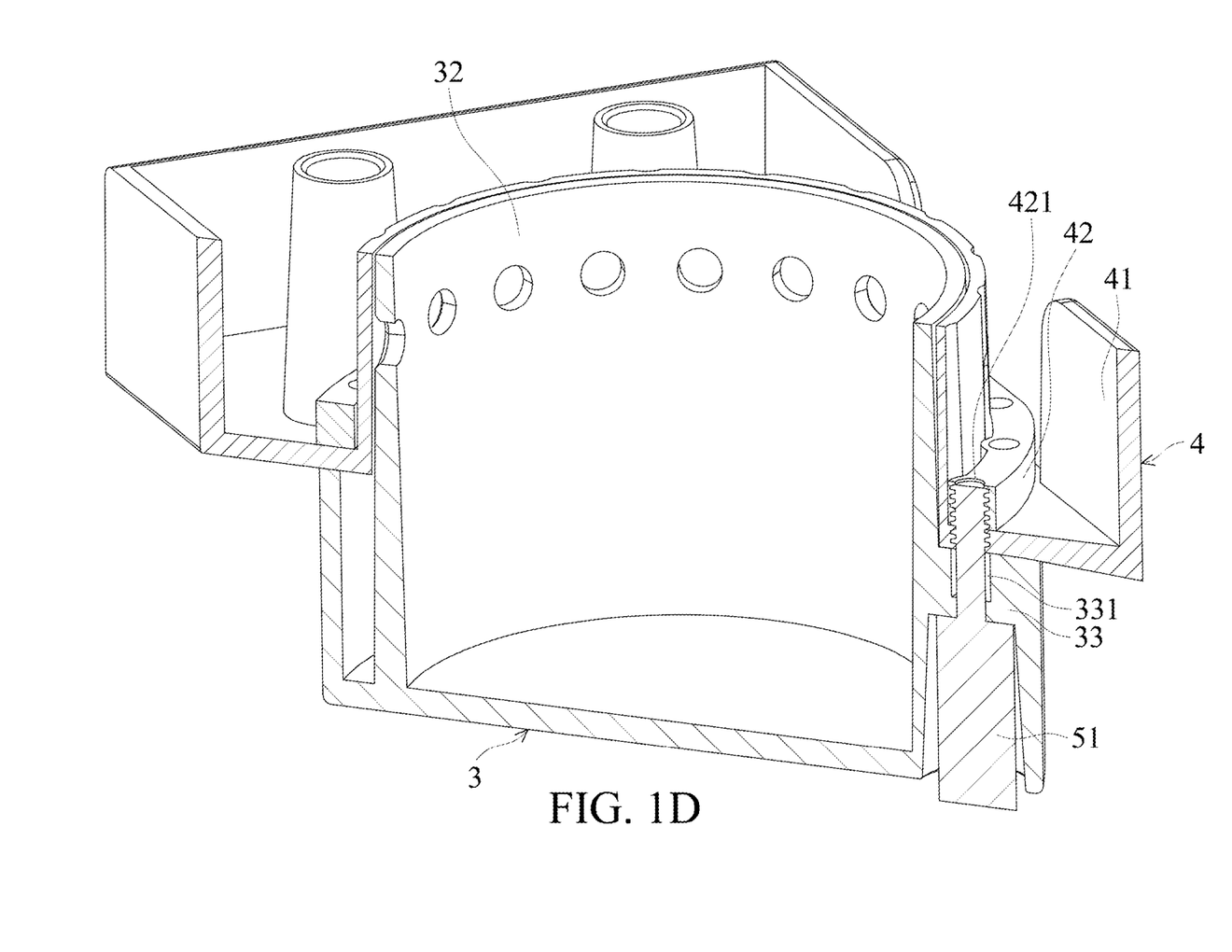
FIG. 1D shows a positioner of the first embodiment of the invention.

FIG. 1D shows a positioner of the first embodiment of the invention. With reference to FIGS. 1A and 1D, in one embodiment, the orientation-adjustment mechanism M1 further comprises a positioner 51. The mounted member 4 further comprises a positioning ring 42. The positioning ring 42 surrounds the mounted ring 412. The positioning ring 42 is affixed to the member housing 41. The positioning ring 42 comprises a plurality of positioning holes 421. The joint unit 301 further comprises a stage 33. The joint ring 32 is connected to the stage 33. The stage 33 comprises a stage through hole 331. The positioner 51 is adapted to pass through the stage through hole 331 and one of the positioning holes 421 to fasten the mounted member 4 in a particular orientation relative to the joint unit 301.

With reference to FIGS. 1A and 1D, in one embodiment, the positioner 51 comprises a bolt, and the bolt is adapted to be selectively affixed to one of the positioning holes 421.

With reference to FIGS. 1A, 1B and 1C, in one embodiment, the joint unit 301 is integrally formed on the second section 22 of the rod 201.

Figure 2:
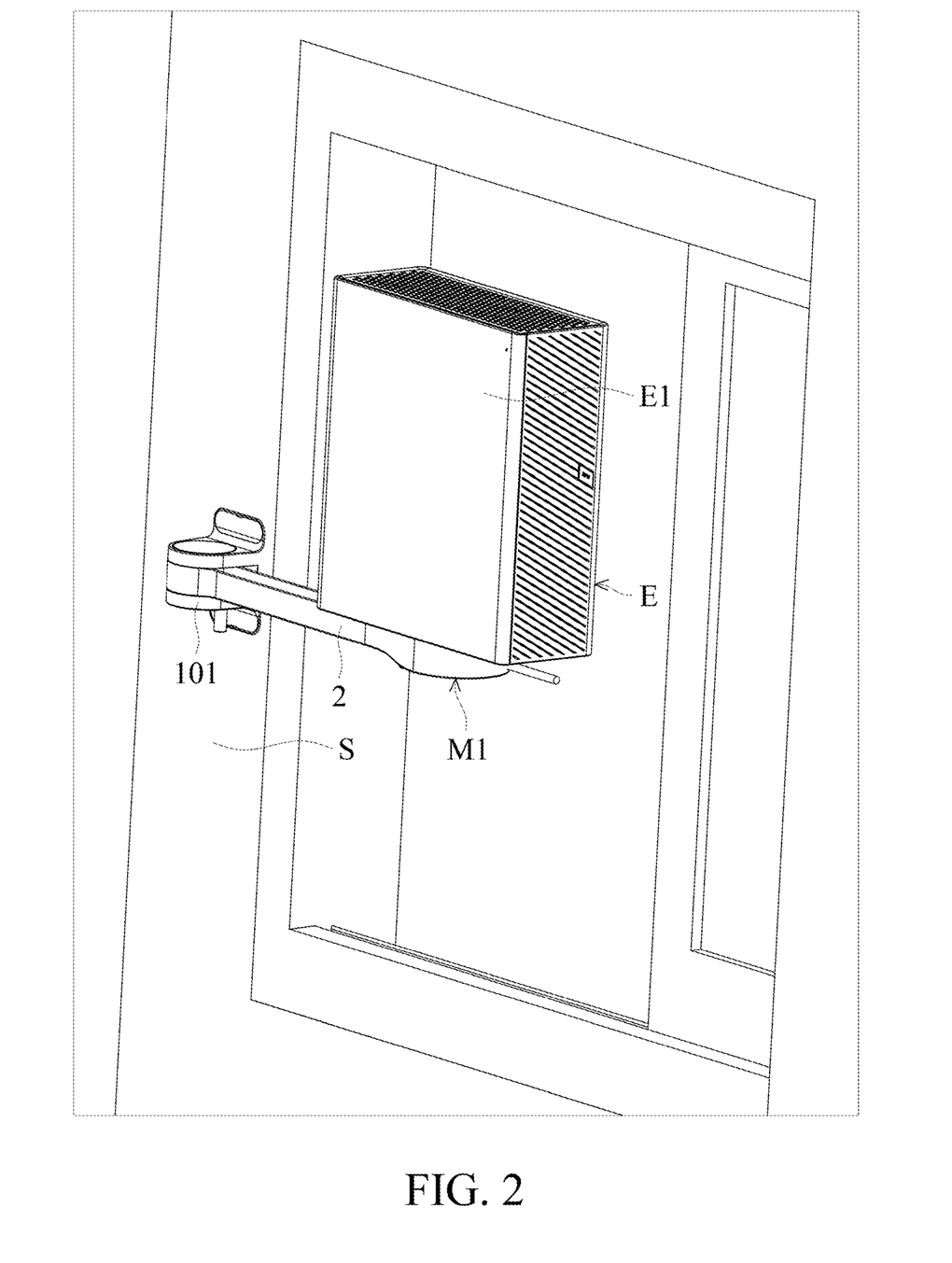
FIG. 2 shows the mounting state of the orientation-adjustment mechanism of the embodiment of the invention.

FIG. 2 shows the mounting state of the orientation-adjustment mechanism of the embodiment of the invention. With reference to FIG. 2, the base 101 is affixed to the mounting surface S. In one embodiment, the orientation-adjustment mechanism M1 is adapted to be connected to an electronic device E. The electronic device E is affixed to the mounted member. The electronic device E comprises a device housing E1 and a wireless transmission module (not shown). The wireless transmission module (not shown) is disposed in the device housing E1. In this embodiment, the mounted member is disposed in the device housing E1. However, the disclosure is not meant to restrict the invention. In another embodiment, the mounted member per se is an electronic device, the mounted member further comprises a wireless transmission module, and the wireless transmission module is disposed inside the member housing.

Figure 3A:
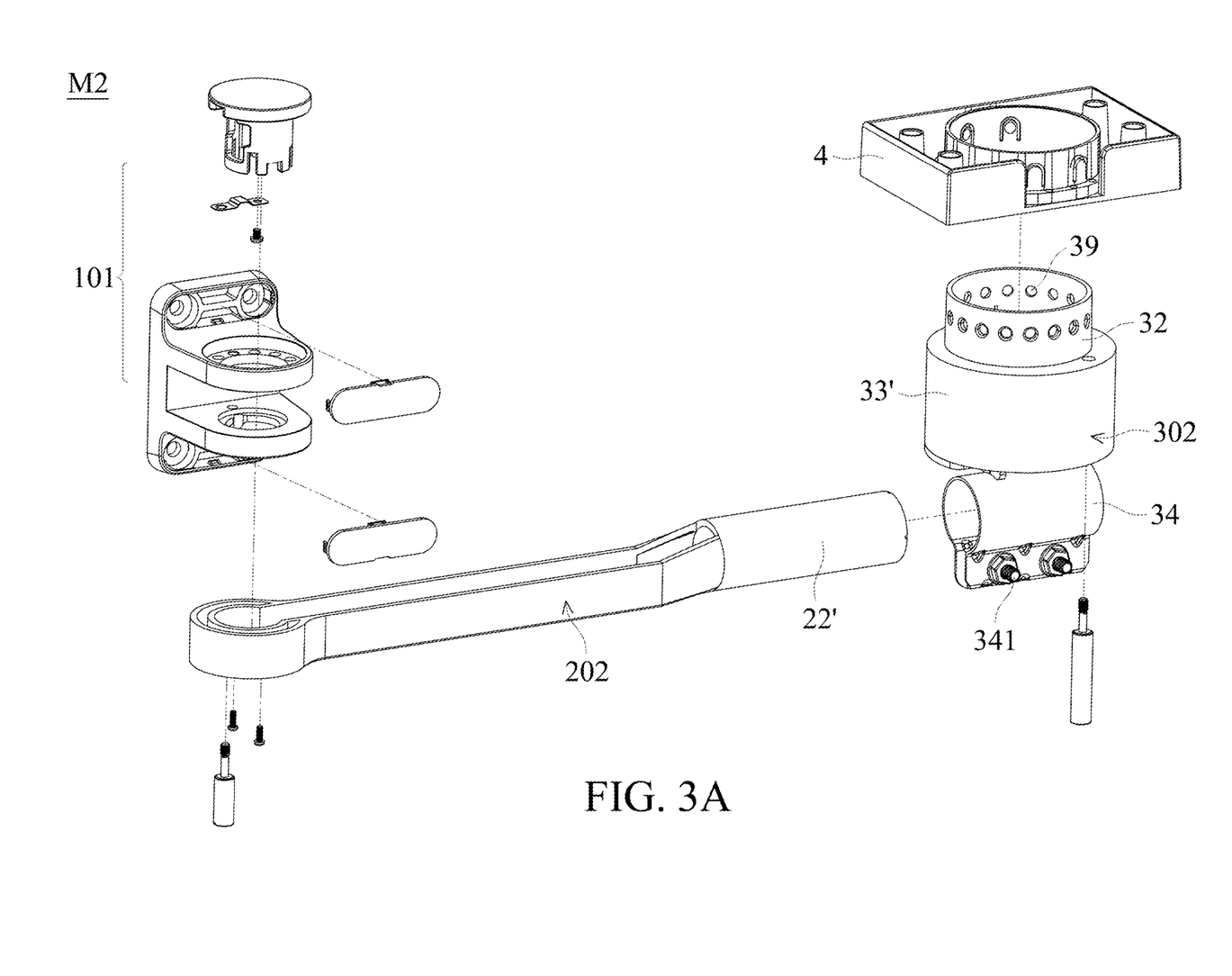
FIG. 3A is an exploded view of an orientation-adjustment mechanism of a second embodiment of the invention.
Figure 3B:
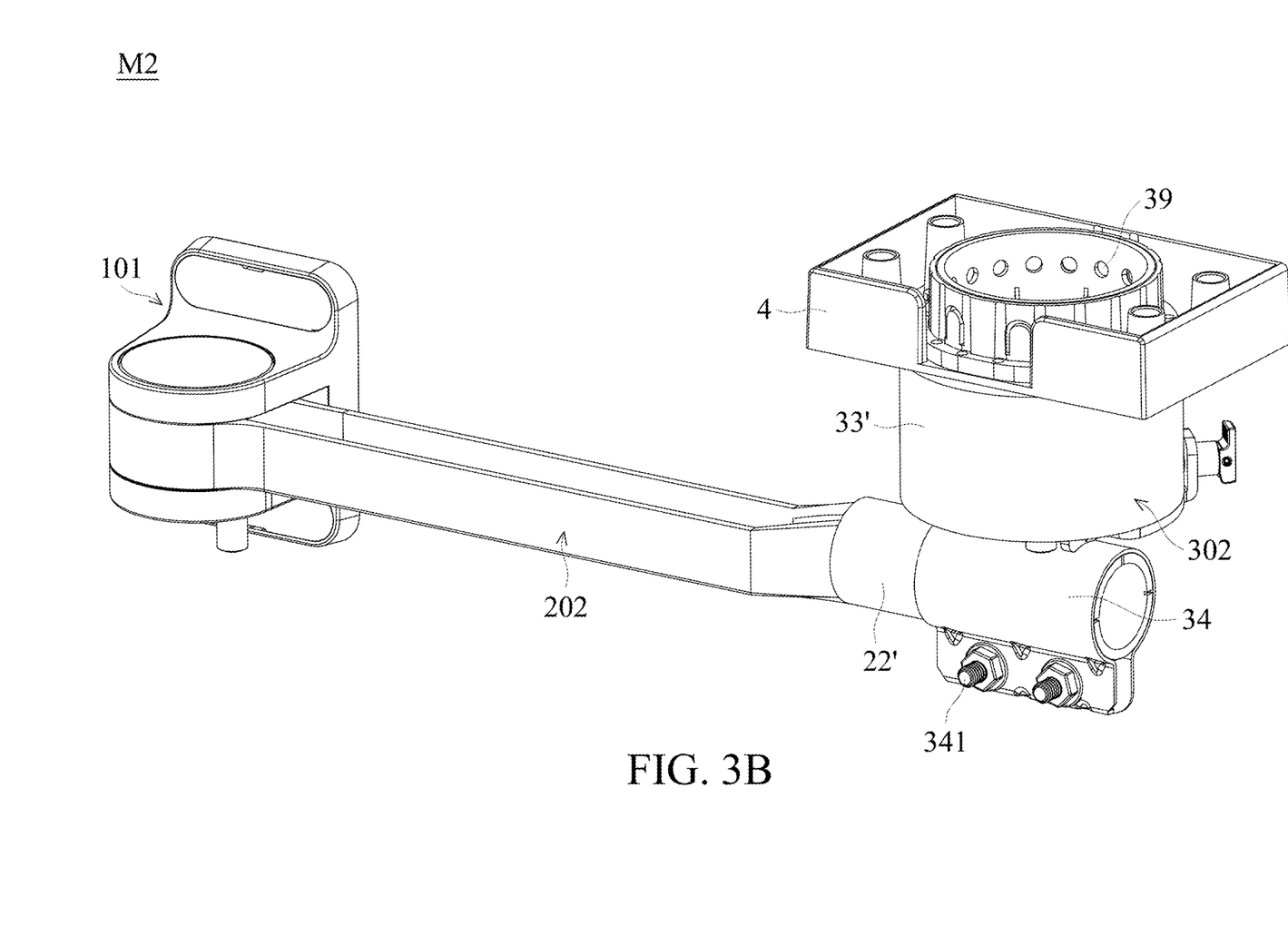
FIG. 3B is an assembled view of the orientation-adjustment mechanism of the second embodiment of the invention.
Figure 3C:
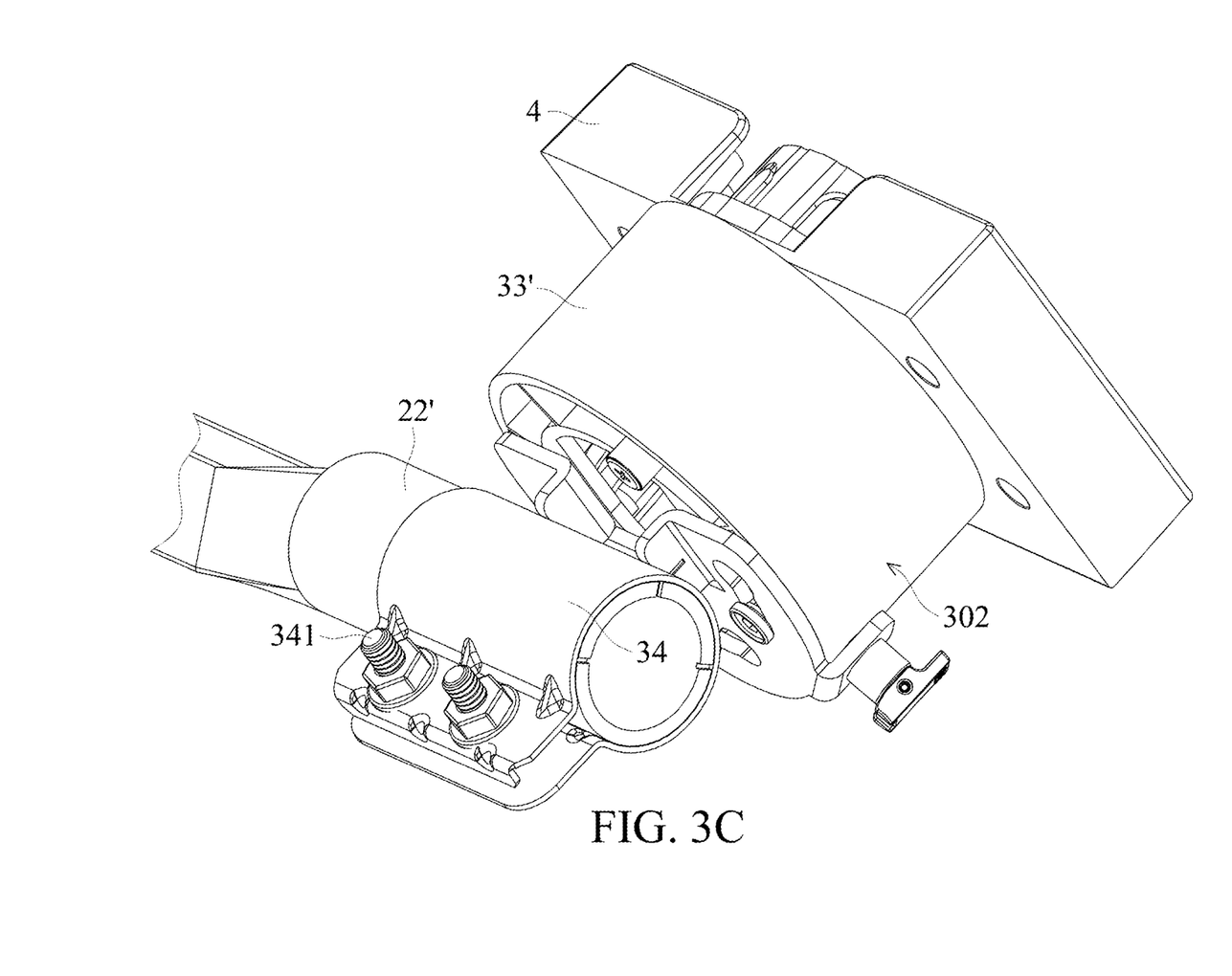
FIG. 3C shows the joint unit being rotated relative to the rod of the second embodiment of the invention.

FIG. 3A is an exploded view of an orientation-adjustment mechanism of a second embodiment of the invention. FIG. 3B is an assembled view of the orientation-adjustment mechanism of the second embodiment of the invention. FIG. 3C shows the joint unit being rotated relative to the rod of the second embodiment of the invention. With reference to FIGS. 3A, 3B and 3C, the orientation-adjustment mechanism M2 of the second embodiment of the invention comprises a base 101, a rod 202, a joint unit 302 and a mounted member 4. In this embodiment, the joint unit 302 pivots on the second section 22' of the rod 202. Particularly, in one embodiment, the joint unit 302 further comprises a bushing 34 and a tightening screw 341. The bushing 34 is telescoped on the second section 22' and is adapted to be rotated relative to the second section 22'. The tightening screw 341 is connected to the bushing 34. The tightening screw 341 is adapted to adjust the holding force of the bushing 34 applied to the second section 22' to fasten the joint unit 302 in a particular orientation relative to the rod 202. Therefore, the joint unit 302 can be rotated relative to the rod 202 to adjust the orientation of the joint unit 302 relative to the rod 202 (FIG. 3C). In this embodiment, the bushing 34 is affixed to the stage 33'. For example, the bushing 34 can be affixed to the stage 33' by welding or with a bolt.

Figure 3D:
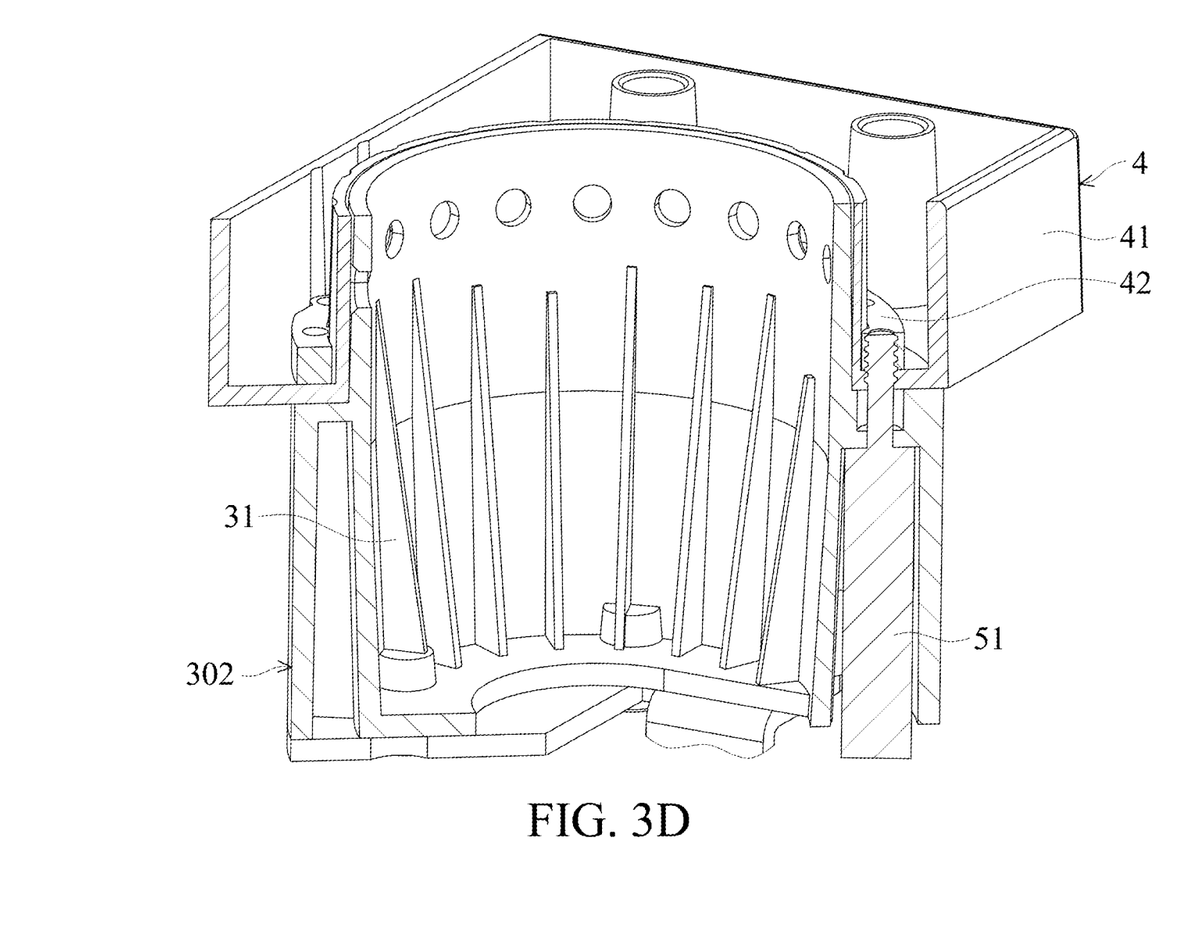
FIG. 3D shows enhancement ribs of the embodiment of the invention.

FIG. 3D shows enhancement ribs of the embodiment of the invention. With reference to FIG. 3D, in one embodiment, the orientation-adjustment mechanism further comprises a plurality of enhancement ribs 31, which are disposed around the inner wall of the joint unit 302. The enhancement ribs 31 increase the structural strength of the joint unit 302.

Figure 4A:
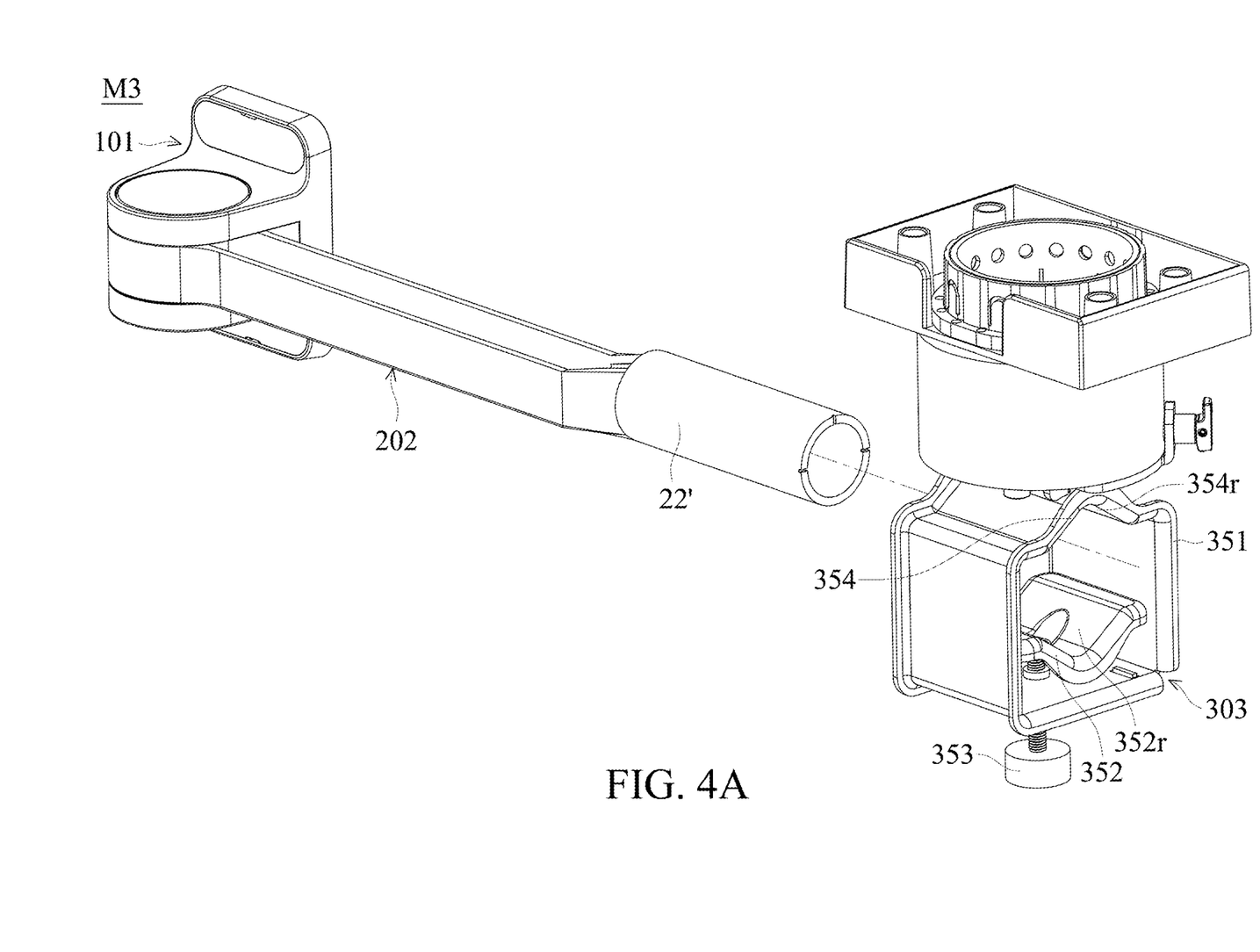
FIG. 4A is an exploded view of an orientation-adjustment mechanism of a third embodiment of the invention.
Figure 4B:
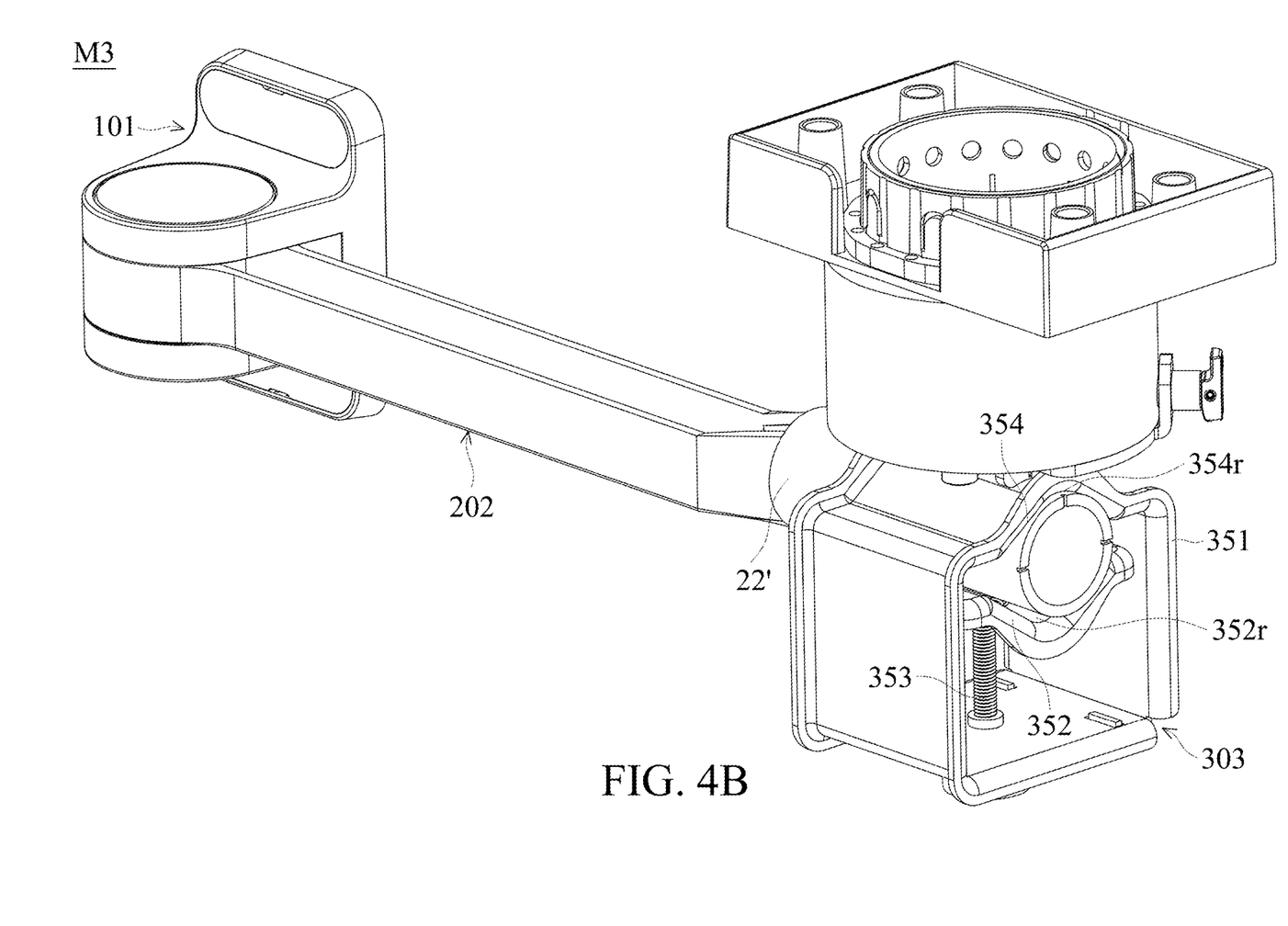
FIG. 4B is an assembled view of the orientation-adjustment mechanism of the third embodiment of the invention.

FIG. 4A is an exploded view of an orientation-adjustment mechanism of a third embodiment of the invention. FIG. 4B is an assembled view of the orientation-adjustment mechanism of the third embodiment of the invention. With reference to FIGS. 4A and 4B, in one embodiment, the joint unit 303 of the orientation-adjustment mechanism M3 further comprises a frame 351, a moveable plate 352 and a tightening screw 353. The second section 22' of the rod 202 is held between the moveable plate 352 and an inner wall 354 of the frame 351, and the tightening screw 353 passes through the frame 351 and pushes the moveable plate 352 to fasten the joint unit 303 in a particular orientation relative to the rod 202.

With reference to FIGS. 4A and 4B, in one embodiment, the second section 22' is a round tube. The moveable plate 352 comprises a first recess 352r. The inner wall 354 of the frame comprises a second recess 354r. The first recess 352r and the second recess 354r hold the second section 22' of the rod 202. The first recess 352r and the second recess 354r can hold the second section 22' sufficiently. In this embodiment, the joint unit 303 can be rotated relative to the rod 202 to adjust the orientation of the joint unit 303 relative to the rod 202.

Figure 5:
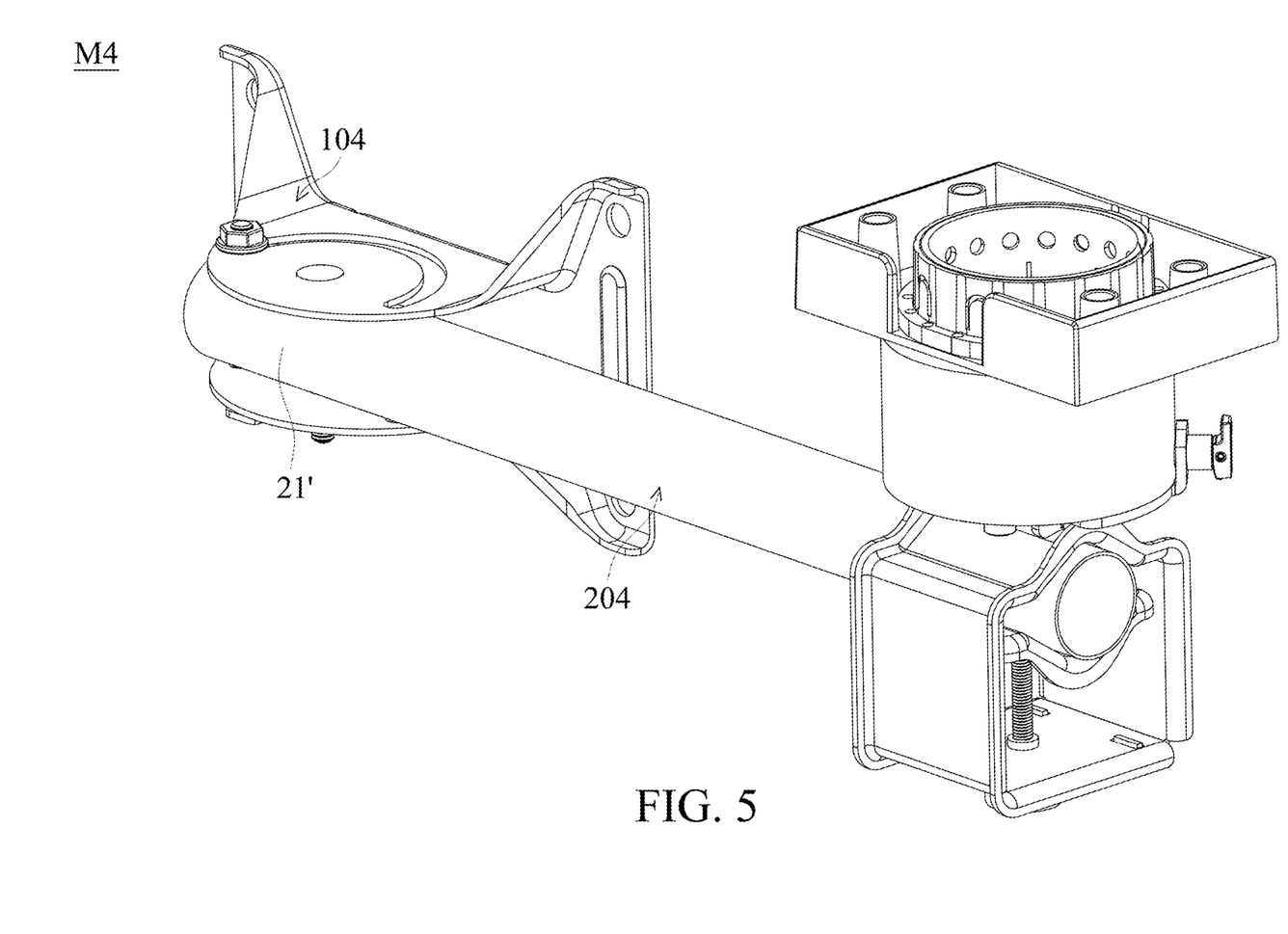
FIG. 5 shows an orientation-adjustment mechanism of a fourth embodiment of the invention.

FIG. 5 shows an orientation-adjustment mechanism of a fourth embodiment of the invention. In this embodiment, the base 104 of the orientation-adjustment mechanism M4 is a sheet-metal member. The first section 21' of the rod 204 is a round tube, and pivots on the base 104.

Utilizing the orientation-adjustment mechanism of the embodiment of the invention, the orientation-adjustment mechanism provides sufficient rotational freedoms, and the electronic device (such as a wireless router) can be adjusted to face left, right, up, or down, and the optimal wireless signal transmission is achieved. Therefore, when the electronic device is disposed in a tall building and the wireless base station is disposed on the street, the orientation of the electronic device can be modified to face the wireless base station to improve wireless signal transmission.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An orientation-adjustment mechanism, adapted to be affixed to a mounting surface, comprising:
   a base, adapted to be affixed to the mounting surface;
   a rod, comprising a first section and a second section, wherein the first section of the rod pivots on the base;
   a joint unit, disposed on the second section of the rod, wherein the joint unit comprises a plurality of joint-positioning portions, and the joint-positioning portions comprise a first joint-positioning portion and a second joint-positioning portion; and
   a mounted member, wherein the mounted member is connected to the joint unit and is adapted to be rotated relative to the joint unit, the mounted member comprises a member housing, the member housing comprises at least one member-positioning portion, and when the mounted member is in a first member orientation relative to the joint unit, the member-positioning portion is wedged into the first joint-positioning portion, and when the mounted member is in a second member orientation relative to the joint unit, the member-positioning portion is wedged into the second joint-positioning portion,
   wherein the joint-positioning portions are holes, the member housing comprises an elastic arm, the member-positioning portion is a protrusion, and the member-positioning portion is formed on a free end of the elastic arm.

2. The orientation-adjustment mechanism as claimed in claim 1, wherein the joint unit comprises a joint ring, the member housing comprises a mounted ring, the mounted ring is telescoped on the joint ring, the joint-positioning portions are disposed around the joint ring, and the mounted ring comprises at least one mounted ring opening.

3. The orientation-adjustment mechanism as claimed in claim 2, wherein the elastic arm is disposed on the mounted ring and extends in the mounted ring opening.

4. The orientation-adjustment mechanism as claimed in claim 2, further comprising a positioner, wherein the mounted member further comprises a positioning ring, the positioning ring surrounds the mounted ring, the positioning ring is affixed to the member housing, the positioning ring comprises a plurality of positioning holes, the joint unit further comprises a stage, the joint ring is connected to the stage, the stage comprises a stage through hole, the positioner is adapted to pass through the stage through hole and one of the positioning holes to fasten the mounted member in a particular orientation relative to the joint unit.

5. The orientation-adjustment mechanism as claimed in claim 4, wherein the positioner comprises a bolt, and the bolt is adapted to be selectively affixed to one of the positioning holes.

6. The orientation-adjustment mechanism as claimed in claim 1, further comprising a plurality of enhancement ribs, and the enhancement ribs are disposed around an inner wall of the joint unit.

7. The orientation-adjustment mechanism as claimed in claim 1, wherein the joint unit is integrally formed on the second section of the rod.

8. The orientation-adjustment mechanism as claimed in claim 1, wherein the joint unit pivots on the second section of the rod.

9. The orientation-adjustment mechanism as claimed in claim 8, wherein the joint unit further comprises a bushing and a tightening screw, the bushing is telescoped on the second section and is adapted to be rotated relative to the second section, the tightening screw is connected to the bushing, the tightening screw is adapted to adjust a holding force of the bushing applied to the second section to fasten the joint unit in a particular orientation relative to the rod.

10. The orientation-adjustment mechanism as claimed in claim 8, wherein the joint unit further comprises a frame, a moveable plate and a tightening screw, the second section of the rod is held between the moveable plate and an inner wall of the frame, and the tightening screw passes through the frame and pushes the moveable plate to fasten the joint unit in a particular orientation relative to the rod.

11. The orientation-adjustment mechanism as claimed in claim 10, wherein the second section is a round tube, the moveable plate comprises a first recess, the inner wall of the frame comprises a second recess, and the first recess and the second recess hold the second section of the rod.

12. The orientation-adjustment mechanism as claimed in claim 1, wherein the mounted member is an electronic device, the mounted member further comprises a wireless transmission module, and the wireless transmission module is disposed inside the member housing.

13. The orientation-adjustment mechanism as claimed in claim 1, wherein the orientation-adjustment mechanism is adapted to be connected to an electronic device, the electronic device is affixed to the mounted member, the electronic device comprises a device housing and a wireless transmission module, and the wireless transmission module is disposed in the device housing.

* * * * *